US 8,983,021 B2

(12) United States Patent
Chen

(10) Patent No.: US 8,983,021 B2
(45) Date of Patent: Mar. 17, 2015

(54) RESET CIRCUIT FOR GATE DRIVER ON ARRAY, ARRAY SUBSTRATE, AND DISPLAY

(71) Applicant: Beijing BOE Optoelectronics Technology Co., Ltd., Beijing (CN)

(72) Inventor: Xi Chen, Beijing (CN)

(73) Assignee: Beijing BOE Optoelectronics Technology Co., Ltd., Beijing (CN)

( * ) Notice: Subject to any disclaimer, the term of this patent is extended or adjusted under 35 U.S.C. 154(b) by 63 days.

(21) Appl. No.: 13/985,147

(22) PCT Filed: Nov. 14, 2012

(86) PCT No.: PCT/CN2012/084594
§ 371 (c)(1),
(2) Date: Aug. 13, 2013

(87) PCT Pub. No.: WO2014/012308
PCT Pub. Date: Jan. 23, 2014

(65) Prior Publication Data
US 2014/0055177 A1 Feb. 27, 2014

(30) Foreign Application Priority Data
Jul. 20, 2012 (CN) .......................... 2012 1 0253796

(51) Int. Cl.
*G11C 19/00* (2006.01)
*H03K 17/22* (2006.01)
(Continued)

(52) U.S. Cl.
CPC .................. *H03K 17/22* (2013.01); *G09G 3/38* (2013.01); *G11C 19/287* (2013.01)
USPC .................. 377/64; 377/78; 377/79

(58) Field of Classification Search
None
See application file for complete search history.

(56) References Cited

U.S. PATENT DOCUMENTS 7,206,264 B1 * 4/2007 Hermanns .................. 369/44.29
7,911,436 B2 * 3/2011 Lee et al. ...................... 345/100
(Continued)

FOREIGN PATENT DOCUMENTS

CN 1870117 A 11/2006
CN 101567219 A 10/2009
(Continued)

OTHER PUBLICATIONS

International Search Report (Chinese language) issued by the International Searching Authority, rendered Jul. 20, 2012, 12 pages.
(Continued)

*Primary Examiner* — Tuan T Lam

(57) ABSTRACT

A reset circuit for Gate Driver on Array, an array substrate and a display is used for increasing reliability and long-term stability of a GOA circuit and thus improving performance of the GOA circuit. The GOA reset circuit includes a first electronic switch circuit (301) connected to an input terminal of a GOA unit of the Gate Driver on Array (INPUT); and a second electronic switch circuit connected to an output terminal of the GOA unit (OUTPUT), wherein the first electronic switch circuit (301) is connected to a low level signal terminal and is switched on to connect the low level signal terminal to a reset terminal of the GOA unit (RESET) when the input terminal of the GOA unit (INPUT) is at a high level; and the second electronic switch circuit (302) is connected to a high level signal terminal and is switched on to connect the high level signal terminal to the reset terminal of the GOA unit (RESET) when the output terminal of the GOA unit (OUTPUT) is at a high level.

17 Claims, 3 Drawing Sheets

(51) Int. Cl.
*G09G 3/38* (2006.01)
*G11C 19/28* (2006.01)

(56) References Cited

U.S. PATENT DOCUMENTS

| | | | |
|---|---|---|---|
| 8,059,780 B2 | 11/2011 | Wang et al. | |
| 8,384,649 B2 * | 2/2013 | Shang | 345/100 |
| 8,810,498 B2 * | 8/2014 | Kim et al. | 345/100 |
| 2006/0227094 A1 | 10/2006 | Park et al. | |
| 2006/0267911 A1 | 11/2006 | Jang | |
| 2006/0269038 A1 * | 11/2006 | Jang et al. | 377/64 |
| 2007/0071158 A1 * | 3/2007 | Wei et al. | 377/64 |
| 2009/0080593 A1 | 3/2009 | Kim et al. | |
| 2014/0152629 A1 * | 6/2014 | So et al. | 345/205 |
| 2014/0169518 A1 * | 6/2014 | Kong et al. | 377/64 |

FOREIGN PATENT DOCUMENTS

| | | | |
|---|---|---|---|
| CN | 101727859 A | 6/2010 | |
| CN | 101789213 A | 7/2010 | |
| KR | 100940999 B1 | 2/2010 | |
| KR | 101002331 B1 | 12/2010 | |

OTHER PUBLICATIONS

The State Intellectual Property Office of the People's Republic of China ("SIPO") (Chinese Language) Office Action issued on Oct. 22, 2013 by SIPO in Chinese Patent Application No. 201210253796.2; five (5) pages.

Espacenet Bibliographic Data, Abstract of CN101567219(A), 1 page.

Espacenet Bibliographic Data, Abstract of CN101727859(A), 1 page.

Espacenet Bibliographic Data, Abstract of CN101789213(A), 1 page.

Espacenet Bibliographic Data, Abstract of KR100940999(B1), 1 page.

Espacenet Bibliographic Data, Abstract of KR101002331(B1), 2 pages.

Espacenet Bibliographic Data, Abstract of CN1870117(A), 1 page.

* cited by examiner

RESET CIRCUIT FOR GATE DRIVER ON ARRAY, ARRAY SUBSTRATE, AND DISPLAY

CROSS REFERENCE TO RELATED APPLICATIONS

This application is based on International Application No. PCT/CN2012/084594 filed on Nov. 14, 2012, which claims priority to Chinese National Application No. 201210253796.2, filed on Jul. 20, 2012, the contents of which are incorporated herein by reference.

TECHNICAL FIELD OF THE DISCLOSURE

The present disclosure relates to a field of display technique and particularly to a reset circuit for gate driver on array, an array substrate and a display.

BACKGROUND

With the rapid development of Thin Film Transistor Liquid Crystal Display (TFT-LCD), new techniques are adopted by individual manufacturers to increase the market competition of their products and decrease the cost of their products.

As a representative of the new techniques, Gate Driver on Array (GOA) integrates a gate switch circuit onto an array substrate to remove a gate driving integrated circuit, so that materials are saved and process steps are reduced, thereby achieving the purpose of decreasing the cost of products.

As shown in FIG. 1, which is a schematic diagram of GOA circuit structure of the prior art, the GOA circuit has a plurality of GOA units, each of which has a normal phase clock signal input terminal CLK, a reverse phase clock signal input terminal CLKB, and a low voltage signal input terminal VSS, and further has an input terminal INPUT, an output terminal OUTPUT, and a reset terminal RESET. An output terminal of the GOA unit for one row is used as an input terminal of the GOA unit for the next row and a reset terminal of a GOA unit for the previous row, and a Frame Start Vertical (STV) signal is used as an input for the GOA unit for the first row.

In such manner, there is no input signal on the reset terminal of the GOA unit for the last row, and the output terminal of the GOA unit for the last row is always in a Multi-out state since the GOA unit for the last row is not reset, which would have an effect on reliability and long-term stability of the GOA unit. A reference is made to a schematic diagram of individual signal timings of the GOA unit shown in FIG. 2.

To this end, in order to raise the reliability and long-term stability of the GOA circuit and thus performance of the GOA circuit, there is a need for a GOA reset manner.

SUMMARY

Embodiments of the present disclosure provide a reset circuit for Gate Driver on Array, an array substrate and a Liquid Crystal Display for solving the problem of the output terminal of the GOA unit for the last row being always in the multi-output state due to floating of the reset terminal of the GOA unit for the last row, so as to raise the reliability and the long-term stability of the GOA circuit and thus the performance of the GOA circuit.

An embodiment of the present disclosure provides a reset circuit for Gate Driver on Array (called simply as a GOA reset circuit hereafter), including a first electronic switch circuit connected to an input terminal of a GOA unit of the Gate Driver on Array; and a second electronic switch circuit connected to an output terminal of the GOA unit, wherein the first electronic switch circuit is connected to a low level signal terminal and is switched on to connect the low level signal terminal to a reset terminal of the GOA unit when the input terminal of the GOA unit is at a high level; and the second electronic switch circuit is connected to a high level signal terminal and is switched on to connect the high level signal terminal to the reset terminal of the GOA unit when the output terminal of the GOA unit is at a high level.

Another embodiment of the present disclosure also provides an array substrate, including the above-described GOA reset circuit.

Yet another embodiment of the present disclosure also provides a display, including the above-described array substrate.

Based on the above technical solution, in embodiments of the present disclosure, the first electronic switch circuit connected to the input terminal of the GOA unit is switched on when the input terminal of the GOA unit is at the high level, such that the low level signal terminal connected to the first electronic switch circuit is connected to the reset terminal of the GOA unit, and such that the GOA unit may output normally when the input terminal thereof is at the high level; the second electronic switch circuit connected to the output terminal of the GOA unit is switched on when the output terminal of the GOA unit is at the high level, such that the high level signal terminal connected to the second electronic switch circuit is connected to the reset terminal of the GOA unit, and such that the output terminal of the GOA unit may be reset when the reset terminal inputs the high level, which solves the problem that the output terminal of the GOA unit for the last row is always in the multi-out state due to floating of the reset terminal of the GOA unit for the last row, and raise the reliability and the long-term stability of the GOA circuit and thus the performance of the GOA circuit.

DETAILED DESCRIPTION

In order to solve the problem that the output terminal of the GOA unit for the last row is always in the multi-out state due to floating of the reset terminal of the GOA unit for the last row, and raise the reliability and the long-term stability of the GOA circuit and thus the performance of the GOA circuit, an embodiment of the present disclosure provides a GOA reset circuit.

In following embodiments, with respect to the problem that the output terminal of the GOA unit for the last row is always in the multi-output state due to floating of the reset terminal of the GOA unit for the last row, the GOA reset circuit provided in the embodiments of the present disclosure is used in a GOA unit for the last row of pixel array, and the following description will be given by taking the GOA reset circuit being used in the GOA unit for the last row as an example.

In following embodiments, the GOA unit is implemented by a shift register.

Preferable implementations provided in the embodiments of the present disclosure will be described below in detail with reference to the accompanying drawings.

Figure 1:
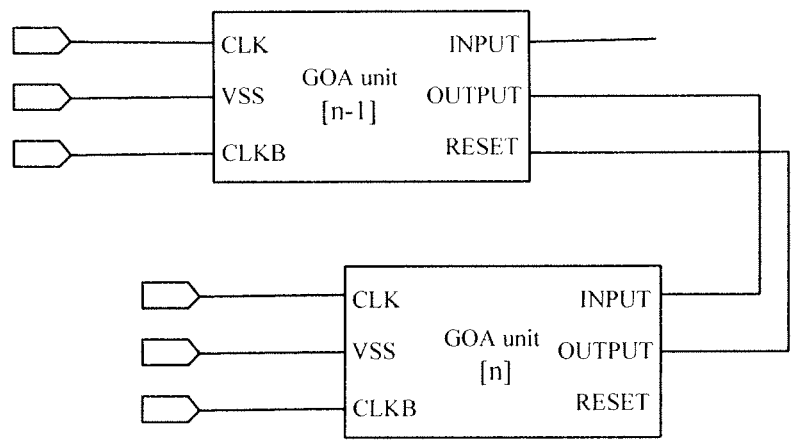
FIG. 1 is a schematic diagram of a GOA circuit structure in the prior art.
Figure 2:
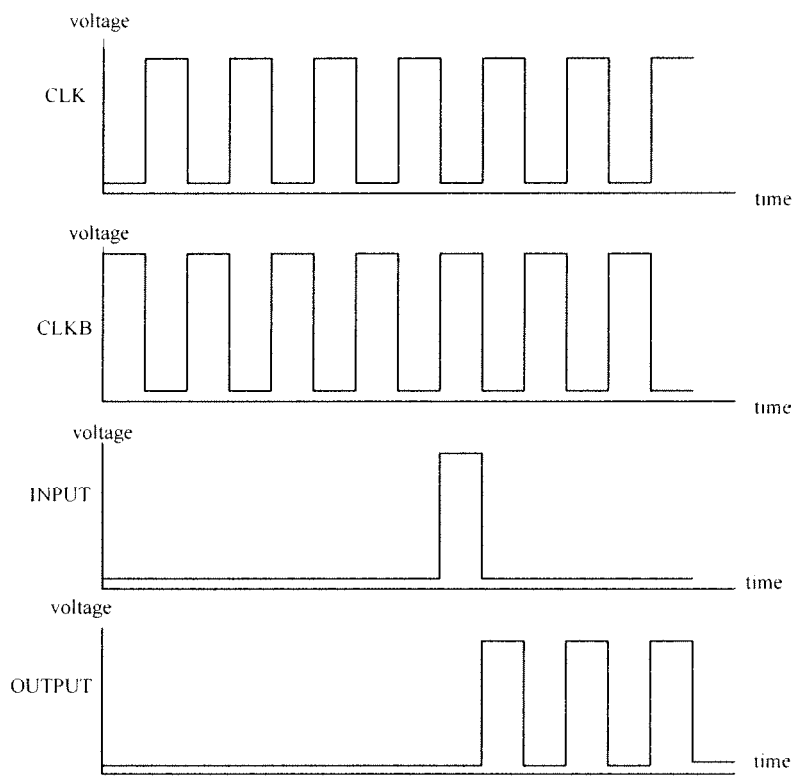
FIG. 2 is a schematic diagram of individual signal timings of a GOA unit in the prior art.
Figure 3:
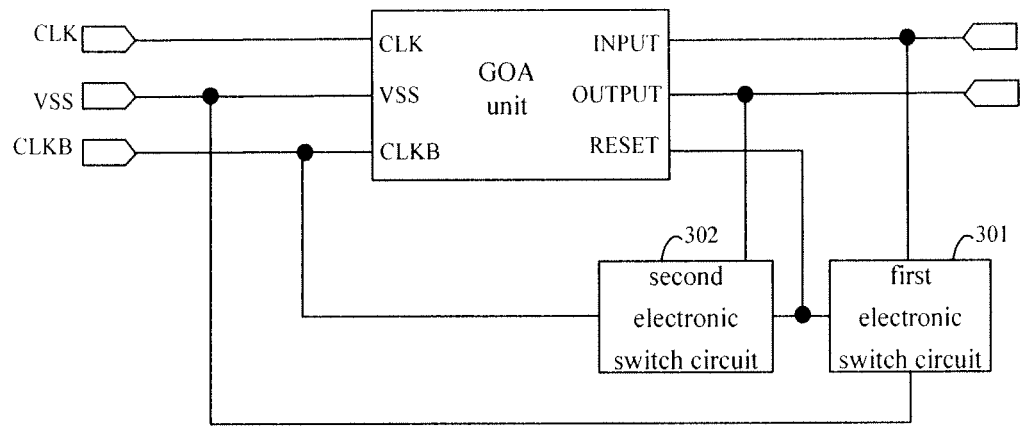
FIG. 3 is a schematic diagram of a GOA reset circuit structure according to embodiments of the present disclosure.

As shown in FIG. 3, the GOA reset circuit provided in embodiments of the present disclosure includes a first electronic switch circuit 301 connected to an input terminal INPUT of a GOA unit; and a second electronic switch circuit 302 connected to an output terminal OUTPUT of the GOA unit, wherein the first electronic switch circuit 301 is connected to a low level signal terminal and is switched on to connect the low level signal terminal to a reset terminal RESET of the GOA unit when the input terminal INPUT of the GOA unit is at a high level; the second electronic switch circuit 302 is connected to a high level signal terminal and is switched on to connect the high level signal terminal to the reset terminal RESET of the GOA unit when the output terminal OUTPUT of the GOA unit is at a high level.

Specifically, a first terminal of the first electronic switch circuit is connected to the input terminal of the GOA unit, a second terminal of the first electronic switch circuit is connected to the low level signal terminal, and a third terminal of the first electronic switch circuit is connected to the reset terminal of the GOA unit; and a first terminal of the second electronic switch circuit is connected to the output terminal of the GOA unit, a second terminal of the second electronic switch circuit is connected to the high level signal terminal, and a third terminal of the second electronic switch circuit is connected to the reset terminal of the GOA unit.

Specifically, the first electronic switch circuit 301 and the second electronic switch circuit 302 can operate independently, and thus can be connected to the reset terminal RESET individually.

Preferably, the first electronic switch circuit 301 and the second electronic switch circuit 302 can be connected together and then connected to the reset terminal RESET, so as to save connection wiring.

Specifically, the low level signal terminal may be a individually externally connected signal line for Direct Current Source low level signal VSS, may be a normal phase clock signal input terminal CLK of the GOA unit (which is at a low level when the first electronic switch circuit 301 operates), and may be a low voltage signal input terminal VSS of the GOA unit. It is preferable that the low level signal terminal VSS is the low voltage signal input terminal of the GOA unit.

Specifically, the high level signal terminal may be a reverse phase clock signal input terminal CLKB of the GOA unit, and may be a individually externally connected signal line which may have a same timing as that of the reverse phase clock signal input terminal CLKB of the GOA unit. It is preferable that the high level signal terminal is the reverse phase clock signal input terminal CLKB of the GOA unit.

Preferably, the first electronic switch circuit includes a switching element which includes but not limited to one of Transistor, Field-Effect Transistor and Thin Film Transistor; the second electronic switch circuit includes a switching element which includes but not limited to one of Transistor, Field-Effect Transistor and Thin Film Transistor.

Specifically, when the first electronic switch circuit is a transistor, a base electrode of the transistor acting as the first electronic switch circuit is connected to the input terminal of the GOA unit, a collector electrode thereof is connected to the low level signal terminal, and an emitter electrode thereof is connected to the reset terminal of the GOA unit.

When the second electronic switch circuit is a transistor, a base electrode of the transistor acting as the second electronic switch circuit is connected to the output terminal of the GOA unit, an emitter electrode thereof is connected to the high level signal terminal, and a collector electrode thereof is connected to the reset terminal of the GOA unit.

Specifically, when the first electronic switch circuit is a Field-Effect Transistor or Thin Film Transistor, a gate of the first electronic switch circuit is connected to the input terminal of the GOA unit, a drain thereof is connected to the low level signal terminal, and a source thereof is connected to the reset terminal of the GOA unit.

When the second electronic switch circuit is a Field-Effect Transistor or Thin Film Transistor, a gate of the second electronic switch circuit is connected to the output terminal of the GOA unit, a source thereof is connected to the high level signal terminal, and a drain thereof is connected to the reset terminal of the GOA unit.

Preferably, the second electronic switch circuit 302 further includes a delay element via which the switching element of the second electronic switch circuit 302 is connected to the output terminal OUTPUT of the GOA unit. Preferably, the delay element is a coupling capacitor.

In the following specific embodiments, detailed description will be given by taking the switching element of the first and second electronic switch circuit 301 and 302 adopting TFT and the clock signal received by the second electronic switch circuit 302 is the reverse phase clock signal as an example.

Figure 4:
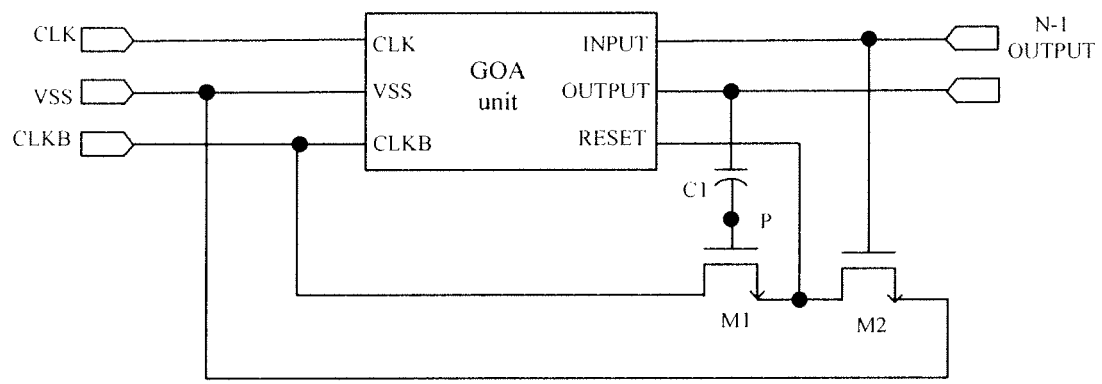
FIG. 4 is a schematic diagram of a GOA reset circuit structure provided in a specific embodiment of the present disclosure.

As shown in FIG. 4, the input terminal INPUT of the GOA unit for the last row of the pixel array is connected to a gate of a switching element M2 of the first electronic switch circuit, and the output terminal OUTPUT of the GOA unit is connected to a gate of a switching element M1 of the second electronic switch circuit via a coupling capacitor C1; a drain of the switching element M2 is connected to the low voltage signal input terminal VSS of the GOA unit, a source of the switching element M1 is connected to a reverse phase clock signal input terminal CLKB of the GOA unit, a source of the switching element M2 is connected to a drain of the switching element M1 and then connected to the reset terminal RESET of the GOA unit. The GOA unit further includes a normal phase clock signal input terminal CLK.

As an example, a node P is the gate of M1.

In the specific embodiment, the input terminal of the GOA unit is connected to the output terminal of the GOA unit for the previous row.

Preferably, a duty cycle of the TFT is less than 50%, which would not have a harmful effect on operational life of the TFT device and the reliability of the GOA circuit.

In another particular embodiment, the input terminal INPUT of the GOA unit for the last row of the pixel array is connected to a gate of a switching element M2 of the first electronic switch circuit, and the output terminal OUTPUT of the GOA unit is connected to a gate of a switching element M1 of the second electronic switch circuit via a coupling capacitor C1; a drain of the switching element M2 is connected to the low voltage signal input terminal VSS of the GOA unit, a source of the switching element M1 is connected to a reverse phase clock signal input terminal CLKB of the GOA unit, a source of the switching element M2 is connected to the reset terminal RESET of the GOA unit, and a drain of the switching element M1 is connected to the reset terminal RESET of the GOA unit.

Figure 5:
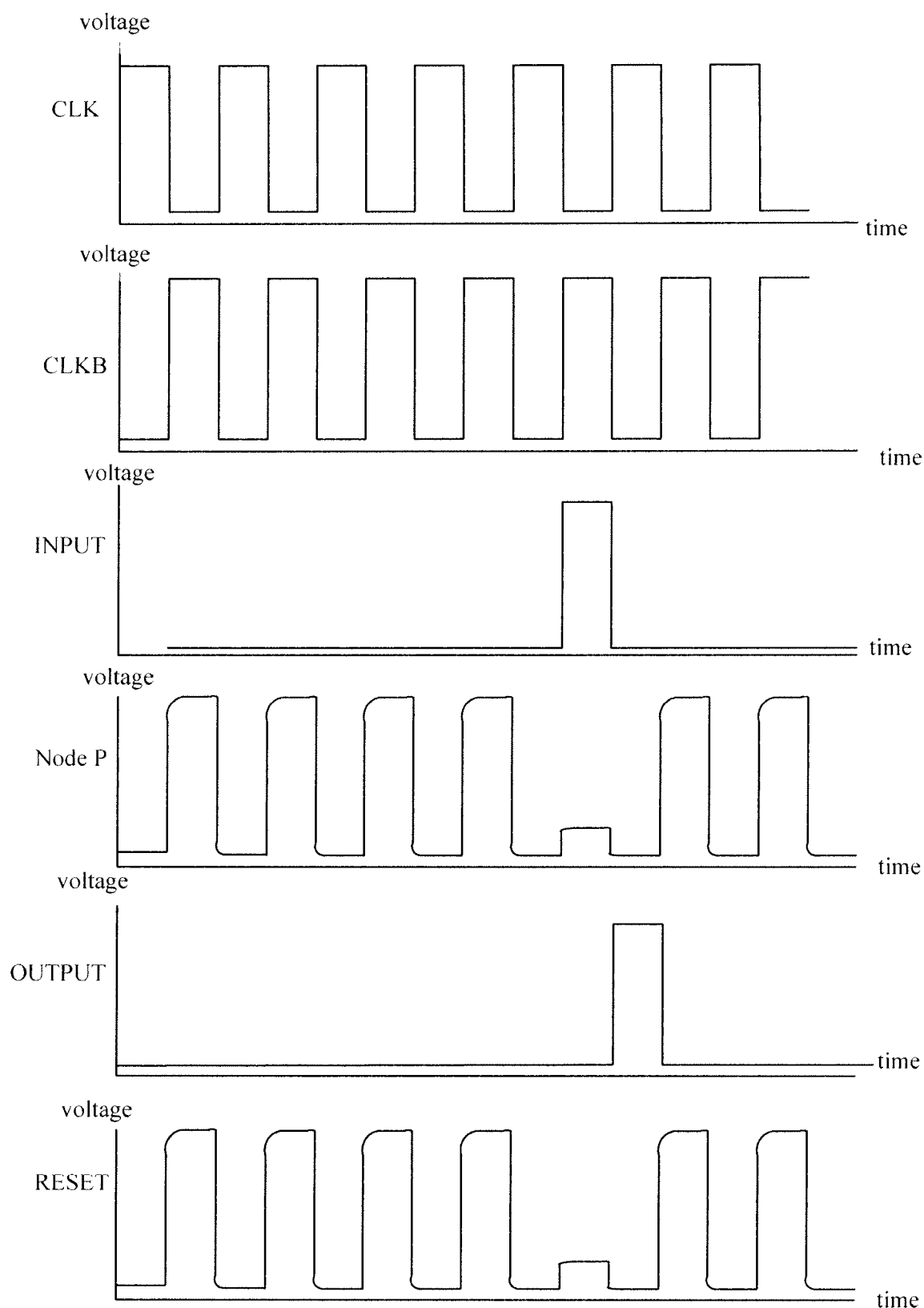
FIG. 5 is a diagram of signal timings of a GOA unit according to embodiments of the present disclosure.

As shown in FIG. 5, it is a timing diagram for signals of the GOA unit provided in the embodiments of the present disclosure. M2 is switched on when the input signal INPUT of the GOA unit becomes a high level pulse signal, so that RESET is pulled down to VSS and OUPUT of the GOA unit outputs normally due to shifting and registering function of the GOA unit, while M1 is switched on due to coupling function to the node P by the coupling capacitor C1. At a next instant, when CLKB becomes a high level pulse signal, RESET outputs a pulse signal being consistent with CLKB, and OUTPUT is pulled down and reset under the control of the signal input from RESET. In the present embodiment, when INPUT is at a high level, the timing diagram of the node P has a little protruding part due to voltage division caused by a large parasitic capacitor of M1.

Based on the same inventive concept, the embodiments of the present disclosure also provides an array substrate including the above-described GOA reset circuit, the particular implementations of which may be obtained by referring to the above description for the GOA reset circuit with the repeated description omitted. It should be understood that the GOA unit in the embodiments of the present disclosure may be other structures in the prior art, and the reset circuit provided in the embodiments of the present disclosure may be adopted as long as the GOA unit includes clock signal input terminals carrying clock signals having levels opposite to each other (normal phase clock signal input terminal CLK and reverse phase clock signal input terminal CLKB), an input terminal INPUT, an output terminal OUTPUT, a reset terminal RESET, and a low level signal terminal VSS.

Preferably, the GOA unit for the last row of the pixel array included in the array substrate employs the above described GOA reset circuit. Of course, other GOA units in the array substrate can also use the reset circuit alone, and can use the reset circuit provided in the present embodiment in combination with technical measures for reset in the prior art.

Based on the same inventive concept, the embodiments of the present disclosure further provide a display including the above-described array substrate, the particular implementations of which may be obtained by referring to the above description for the GOA reset circuit with the repeated description omitted.

Based on the above technical solution, in the embodiments of the present disclosure, the first electronic switch circuit connected to the input terminal of the GOA unit is switched on when the input terminal of the GOA unit is at the high level, such that the low level signal terminal connected to the first electronic switch circuit is connected to the reset terminal of the GOA unit, and such that the GOA unit may output normally when the input terminal thereof is at the high level; the second electronic switch circuit connected to the output terminal of the GOA unit is switched on when the output terminal of the GOA unit is at the high level, such that the high level signal terminal connected to the second electronic switch circuit is connected to the reset terminal of the GOA unit, and such that the output terminal of the GOA unit may be reset when the reset terminal is at the high level, which solves the problem of the output terminal of the GOA unit for the last row being always in the multi-output state due to floating of the reset terminal of the GOA unit for the last row, increasing the reliability and the long-term stability of the GOA circuit and thus the performance of the GOA circuit.

The above descriptions are only for illustrating the embodiments of the present disclosure, and in no way limit the scope of the present disclosure. It will be obvious that those skilled in the art may make modifications, variations and equivalences to the above embodiments without departing the spirit and scope of the present disclosure as defined by the following claims. Such variations and modifications are intended to be included within the spirit and scope of the present disclosure.

What is claimed is:

1. A reset circuit for Gate Driver on Array GOA, comprising:
   a first electronic switch circuit connected to an input terminal of a GOA unit of the Gate Driver on Array; and
   a second electronic switch circuit connected to an output terminal of the GOA unit,
   wherein the first electronic switch circuit is connected to a low level signal terminal and is switched on to connect the low level signal terminal to a reset terminal of the GOA unit when the input terminal of the GOA unit is at a high level; and
   the second electronic switch circuit is connected to a high level signal terminal and is switched on to connect the high level signal terminal to the reset terminal of the GOA unit when the output terminal of the GOA unit is at a high level.

2. The GOA reset circuit of claim 1, wherein a first terminal of the first electronic switch circuit is connected to the input terminal of the GOA unit, a second terminal of the first electronic switch circuit is connected to the low level signal terminal, and a third terminal of the first electronic switch circuit is connected to the reset terminal of the GOA unit; and
   a first terminal of the second electronic switch circuit is connected to the output terminal of the GOA unit, a second terminal of the second electronic switch circuit is connected to the high level signal terminal, and a third terminal of the second electronic switch circuit is connected to the reset terminal of the GOA unit.

3. The GOA reset circuit of claim 1, wherein the low level signal terminal connected to the first electronic switch circuit is the low voltage signal input terminal of the GOA unit, and the high level signal terminal connected to the second electronic switch circuit is a reverse phase clock signal input terminal of the GOA unit.

4. The GOA reset circuit of claim 1, wherein the first electronic switch circuit includes a switching element which is one of Transistor, Field-Effect Transistor and Thin Film Transistor;
   the second electronic switch circuit includes a switching element which is one of Transistor, Field-Effect Transistor and Thin Film Transistor.

5. The GOA reset circuit of claim 4, wherein the second electronic switch circuit further includes a delay element via which the switching element of the second electronic switch circuit is connected to the output terminal of the GOA unit.

6. The GOA reset circuit of claim 5, wherein the delay element is a coupling capacitor.

7. The GOA reset circuit of claim 6, wherein the GOA unit is a shift register.

8. An array substrate including the GOA reset circuit which comprises:
   a first electronic switch circuit connected to an input terminal of a GOA unit of the Gate Driver on Array; and
   a second electronic switch circuit connected to an output terminal of the GOA unit,
   wherein the first electronic switch circuit is connected to a low level signal terminal and is switched on to connect the low level signal terminal to a reset terminal of the GOA unit when the input terminal of the GOA unit is at a high level; and
   the second electronic switch circuit is connected to a high level signal terminal and is switched on to connect the high level signal terminal to the reset terminal of the GOA unit when the output terminal of the GOA unit is at a high level.

9. The array substrate of claim 8, wherein a first terminal of the first electronic switch circuit is connected to the input terminal of the GOA unit, a second terminal of the first electronic switch circuit is connected to the low level signal terminal, and a third terminal of the first electronic switch circuit is connected to the reset terminal of the GOA unit; and a first terminal of the second electronic switch circuit is connected to the output terminal of the GOA unit, a second terminal of the second electronic switch circuit is connected to the high level signal terminal, and a third terminal of the second electronic switch circuit is connected to the reset terminal of the GOA unit.

10. The array substrate of claim 8, wherein the low level signal terminal connected to the first electronic switch circuit is the low level signal input terminal of the GOA unit, and the high level signal terminal connected to the second electronic switch circuit is a reverse phase clock signal input terminal CLKB of the GOA unit.

11. The array substrate of claim 8, wherein
the first electronic switch circuit includes a switching element which is one of Transistor, Field-Effect Transistor and Thin Film Transistor;
the second electronic switch circuit includes a switching element which is one of Transistor, Field-Effect Transistor and Thin Film Transistor.

12. The array substrate of claim 11, wherein the second electronic switch circuit further includes a delay element via which the switching element of the second electronic switch circuit is connected to the output terminal of the GOA unit.

13. The array substrate of claim 12,
wherein the delay element is a coupling capacitor.

14. The array substrate of claim 13, wherein the GOA unit is a shift register.

15. The array substrate of claim 14, wherein a GOA unit for the last row employs said GOA reset circuit.

16. A display including the array substrate of claim 8.

17. A display including the array substrate of claim 15.

* * * * *